(12) United States Patent
Pickett et al.

(10) Patent No.: US 8,431,921 B2
(45) Date of Patent: Apr. 30, 2013

(54) MEMRISTOR HAVING A TRIANGULAR SHAPED ELECTRODE

(75) Inventors: Matthew D. Pickett, San Francisco, CA (US); Julien Borghetti, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 72 days.

(21) Appl. No.: 13/130,827

(22) PCT Filed: Jan. 13, 2009

(86) PCT No.: PCT/US2009/030827
§ 371 (c)(1),
(2), (4) Date: May 24, 2011

(87) PCT Pub. No.: WO2010/082922
PCT Pub. Date: Jul. 22, 2010

(65) Prior Publication Data
US 2011/0227030 A1    Sep. 22, 2011

(51) Int. Cl.
*H01L 29/02*    (2006.01)
(52) U.S. Cl.
USPC ............... 257/4; 257/2; 257/3; 257/E29.002; 438/102; 438/103; 438/104; 365/163
(58) Field of Classification Search .......... 257/1–5, 257/E29.002; 438/102–104; 365/163
See application file for complete search history.

(56) References Cited

U.S. PATENT DOCUMENTS

| 4,839,700 | A | 6/1989 | Ramesham |
| 5,687,112 | A | 11/1997 | Ovshinsky |
| 6,087,674 | A | 7/2000 | Ovshinsky |
| 6,204,139 | B1 | 3/2001 | Liu |
| RE37,259 | E | 7/2001 | Ovshinsky |
| 6,458,621 | B1 | 10/2002 | Beck |
| 6,487,106 | B1 | 11/2002 | Kozicki |
| 6,507,061 | B1 | 1/2003 | Hudgens et al. |
| 6,508,061 | B2 | 1/2003 | Stuttaford |
| 6,512,241 | B1 | 1/2003 | Lai |
| 6,670,628 | B2 | 12/2003 | Lee |
| 6,746,892 | B2 | 6/2004 | Lee et al. |
| 6,855,647 | B2 | 2/2005 | Beck |
| 6,870,751 | B2 | 3/2005 | Van Brocklin |

(Continued)

FOREIGN PATENT DOCUMENTS

| EP | 1482513 | 12/2004 |
| JP | 2004355676 | 12/2004 |

(Continued)

OTHER PUBLICATIONS

Blanc, Joseph et al, "Electrocoloration in SrTiO3: Vacancy Drift and Oxidation-Reduction of Transition Metals", Physical Review B, vol. 4, No. 10, Nov. 15, 1971, pp. 3548-3557.

(Continued)

*Primary Examiner* — Jami M Valentine

(57) ABSTRACT

A memristor includes a first electrode having a triangular cross section, in which the first electrode has a tip and a base, a switching material positioned upon the first electrode, and a second electrode positioned upon the switching material. The tip of the first electrode faces the second electrode and an active region in the switching material is formed between the tip of the first electrode and the second electrode.

14 Claims, 5 Drawing Sheets

U.S. PATENT DOCUMENTS

| | | | |
|---|---|---|---|
| 6,972,238 B2 | 12/2005 | Hsu et al. | |
| 7,208,372 B2 | 4/2007 | Hsu | |
| 7,292,469 B2 | 11/2007 | Lee et al. | |
| 7,361,924 B2 | 4/2008 | Breuil et al. | |
| 7,374,174 B2 | 5/2008 | Liu et al. | |
| 7,381,982 B2 | 6/2008 | Hsueh | |
| 7,521,122 B2 | 4/2009 | Noro et al. | |
| 7,538,338 B2 | 5/2009 | Rinerson et al. | |
| 7,612,358 B2 | 11/2009 | Joo et al. | |
| 7,618,708 B2 | 11/2009 | Mizuno et al. | |
| 7,738,280 B2 | 6/2010 | Yoshii et al. | |
| 7,820,064 B2 | 10/2010 | Jin | |
| 7,897,955 B2 | 3/2011 | Jin | |
| 7,998,804 B2 | 8/2011 | Park et al. | |
| 8,029,722 B2 | 10/2011 | Mattila et al. | |
| 2002/0172064 A1 | 11/2002 | Chen | |
| 2003/0173612 A1 | 9/2003 | Krieger | |
| 2005/0079551 A1 | 4/2005 | Mizuno et al. | |
| 2005/0127524 A1 | 6/2005 | Sakamoto et al. | |
| 2005/0180189 A1 | 8/2005 | Happ | |
| 2006/0049390 A1 | 3/2006 | Ufert | |
| 2006/0076549 A1 | 4/2006 | Ufert | |
| 2006/0098472 A1 | 5/2006 | Ahn et al. | |
| 2006/0121391 A1 | 6/2006 | Khang et al. | |
| 2006/0126423 A1 | 6/2006 | Aratani et al. | |
| 2006/0152961 A1 | 7/2006 | Kim | |
| 2006/0160304 A1 | 7/2006 | Hsu et al. | |
| 2006/0175598 A1 | 8/2006 | Krieger | |
| 2006/0175646 A1 | 8/2006 | Gaun | |
| 2006/0268598 A1 | 11/2006 | Snider | |
| 2006/0291268 A1 | 12/2006 | Happ et al. | |
| 2007/0012956 A1 | 1/2007 | Gutsche et al. | |
| 2007/0045704 A1 | 3/2007 | Ufert et al. | |
| 2007/0090444 A1 | 4/2007 | Park et al. | |
| 2007/0167008 A1 | 7/2007 | Hsu et al. | |
| 2008/0079029 A1 | 4/2008 | Williams | |
| 2008/0090337 A1 | 4/2008 | Williams | |
| 2008/0099820 A1 | 5/2008 | Coppard et al. | |
| 2008/0206931 A1* | 8/2008 | Breuil et al. | 438/128 |
| 2008/0268288 A1 | 10/2008 | Jin | |
| 2008/0308783 A1 | 12/2008 | Ahn et al. | |
| 2009/0081431 A1 | 3/2009 | Mattila et al. | |
| 2009/0233422 A1 | 9/2009 | Krieger et al. | |
| 2009/0236079 A1 | 9/2009 | Khodadadi | |
| 2010/0127232 A1 | 5/2010 | Boeve et al. | |
| 2011/0221027 A1 | 9/2011 | Quitoriano et al. | |
| 2011/0227022 A1 | 9/2011 | Cho | |
| 2011/0227030 A1 | 9/2011 | Pickett | |
| 2011/0228593 A1 | 9/2011 | Strukov | |
| 2011/0261608 A1 | 10/2011 | Borghetti et al. | |
| 2011/0266510 A1 | 11/2011 | Quitoriano et al. | |
| 2011/0266513 A1 | 11/2011 | Williams et al. | |

FOREIGN PATENT DOCUMENTS

| | | |
|---|---|---|
| JP | 2005028734 | 2/2005 |
| JP | 2005509266 | 4/2005 |
| JP | 2006173267 | 6/2006 |
| JP | 2008505499 | 2/2008 |
| WO | WO-03058638 | 7/2003 |
| WO | WO-03094227 | 11/2003 |
| WO | WO-2006007525 | 1/2006 |

OTHER PUBLICATIONS

Choi, B.J. et al, "Resistive switching mechanism of TiO2 thin films grown by atomic-layer deposition", Joural of Applied Physics 98, 033715, copyright 2005, pp. 033715-1 through 033715-10.

Coey, et al, "Mixed-Valence Manganites", Advances in Physics, 1999, V. 48(2), pp. 167-293.

Knauth, P., "Defect and transport properties of nonocrystalline ceramics and thin films", J. Solid State Electrochem (2002) vol. 6, 165-171.

PCT International Search Report, Nov. 20, 2008, PCT/US2007/021357.

PCT International Search Report, Aug. 26, 2009, PCT/US2009/030827.

Rothchild, A et al, "Electronic and transport properties of reduced and oxidized nanocrystalline TiO2 Films", Applied Physical Letters, vol. 82, No. 4, Jan. 27, 2003, pp. 574-576.

Schroter, W., et al., "Taschenbuch der Chemie", 1988, Verlag Harri Deautsch, Thun und Frankfurt.M., 13. Auflage, S. 137.

Weibel, A., et al., "Electrical properties and defect chemistry of anatase (TiO2)", Solid State Ionics 177 (2006), Elsevier, www.elsevier.com; 229-236.

Yoo et al., "Site-Specific Magnetic Assembly of Nanowires for Sensor Arrays Fabrication", IEEE Transactions on Nanotechnology, vol. 7 Issue 3 pp. 251-255.

* cited by examiner

MEMRISTOR HAVING A TRIANGULAR SHAPED ELECTRODE

CROSS-REFERENCE TO RELATED APPLICATION

The present application has the same Assignee and shares some common subject matter with U.S. Patent Application Publication No. 20080090337, filed on Oct. 3, 2006, by R. Stanley Williams, the disclosure of which is hereby incorporated by reference in its entirety.

BACKGROUND

Solid state memristive devices rely on the drift of mobile charge dopants upon the application of an electrical field, as discussed in the 20080090337 Patent Publication. These types of devices have been found to have promising properties in the fields of both digital and analog non-volatile electronic logic. To illustrate the potential of analog non-volatile electronic logic, synaptic computing has emerged as a potential technology that is enabled by the relatively small size, low cost, and low power consumption provided by solid state memristive devices.

Researchers have designed nano-scale reversible switches with an ON-to-OFF conductance ratio of $10^4$. Crossbar circuitry is often constructed using these types of switches. A useful configuration of this crossbar circuitry is a latch, which is an important component for constructing logic circuits and communicating between logic and memory. Researchers have described logic families entirely constructed from crossbar arrays of switches, as well as hybrid structures using switches and transistors. The devices that are presently fabricated have room for improvement particularly in terms of cyclability.

BRIEF DESCRIPTION OF THE DRAWINGS

Embodiments are illustrated by way of example and not limited in the following figure(s), in which like numerals indicate like elements, in which.

DETAILED DESCRIPTION

Figure 1A:
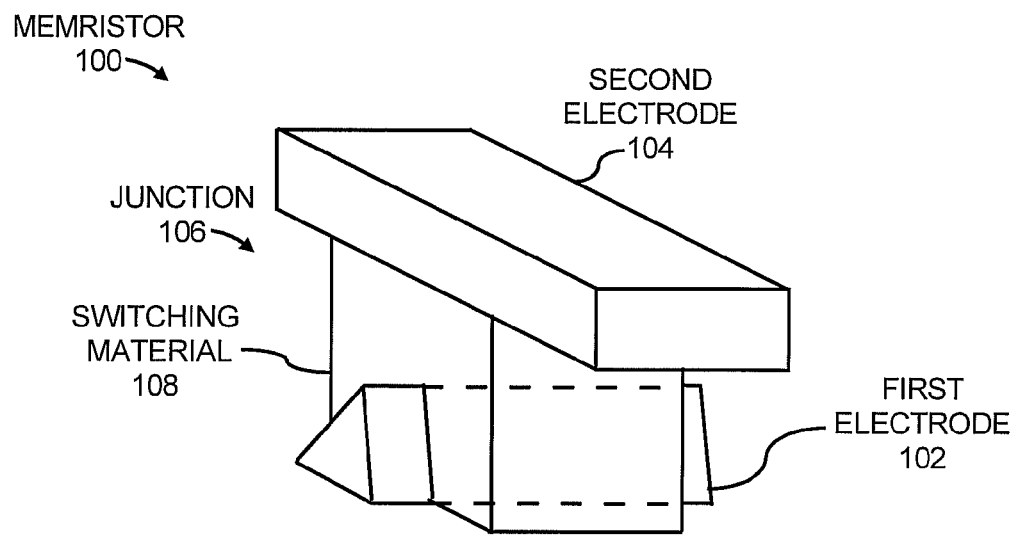
FIG. 1A illustrates a perspective view of a memristor having a first electrode and a second electrode, according to an embodiment of the invention.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein is a memristor having an electrode with a triangular cross section that improves the electrical field lines between electrodes and thus the performance of the memristor. More particularly, the triangular-shaped electrode of the memristor disclosed herein enables the drift of mobile charge dopants to be more focalized as compared with conventional memristive devices, which results in improved performance.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch is able to change its state only once via an irreversible process such as an oxidation or reduction reaction; such a switch may be the basis of a programmable read only memory (PROM), for example.

The term "reconfigurable" means that a switch can change its state multiple times via a reversible process such as an oxidation or reduction; in other words, the switch may be opened and closed multiple times such as the memory bits in a random access memory (RAM).

The term "configurable" means either "singly configurable" or "reconfigurable".

Micron-scale dimensions refer to dimensions that range from 1 micrometer to a few micrometers in size.

Sub-micron scale dimensions refer to dimensions that range from 0.1 nanometers to 50 nanometers (0.05 micrometers).

Micron-scale and submicron-scale wires refer to rod or ribbon-shaped conductors or semiconductors with widths or diameters having the dimensions of 0.04 to 10 micrometers, heights that can range from a few nanometers to a micrometer, and lengths of several micrometers and longer.

A memristor is a two-terminal dynamical electrical device that acts as a passive current limiter in which the instantaneous resistance state is a function of bias history. One embodiment of a memristor is a two-terminal device in which the electrical flux, or time integral of the electric field, between the terminals is a function only of the amount of electric charge, or time integral of the current, that has passed through the device.

A crossbar is an array of switches, here memristors, that can connect each wire in one set of parallel wires to every member of a second set of parallel wires that intersects the first set (usually the two sets of wires are perpendicular to each other, but this is not a necessary condition).

As used herein, the functional dimension of the device is measured in nanometers (typically less than 50 nm), but the lateral dimensions may be nanometers, sub-microns or microns.

The term "triangular" refers to shapes that are triangular and to shapes that are not perfectly triangular and thus may include any suitable shapes that have a base portion that is substantially larger than a tip portion, such shapes being considered as being substantially triangular. In this regard, shapes that do not come to a point at their tips but whose tips are significantly smaller than the bases of the shapes are considered to be triangular.

With reference first to FIG. 1A, there is shown a perspective view of a memristor 100, according to an embodiment. It should be understood that the memristor 100 depicted in FIG. 1A may include additional components and that some of the components described herein may be removed and/or modified without departing from a scope of the memristor 100. It should also be understood that the components depicted in FIG. 1A are not drawn to scale and thus, the components may have different relative sizes with respect to each other than as shown therein.

As depicted in FIG. 1A, the memristor 100 includes a first electrode 102 connected to a second electrode 104. In addition, the first electrode 102 is in a crossed arrangement with the second electrode 104. One or both of the first electrode 102 and the second electrode 104 may be formed of metal or semiconductor materials. By way of particular example, both of the first electrode 102 and the second electrode 104 are formed of platinum.

A switch junction 106 is depicted as connecting the first electrode 102 to the second electrode 104. The switch junction 106 is composed of a switching material 108, which may be formed of a metal oxide, such as, TiO2. In one regard, the switching material 108 is configured to have a conductive channel formed into the material by a localized field-driven atomic modification. In another embodiment, the switching material 108 is formed of any suitable material that is formed of molecules having a switchable segment or moiety that is relatively energetically stable in two different states.

The first electrode 102 is also depicted as being positioned within the switching material 108. The first electrode 102 has a triangular cross section, with the base of the first electrode 108 situated away from the second electrode 104 and the top of the first electrode 102 facing toward the second electrode 104. Various aspects of the first electrode 102 will be discussed in greater detail herein below with respect to FIG. 2A.

Figure 1B:
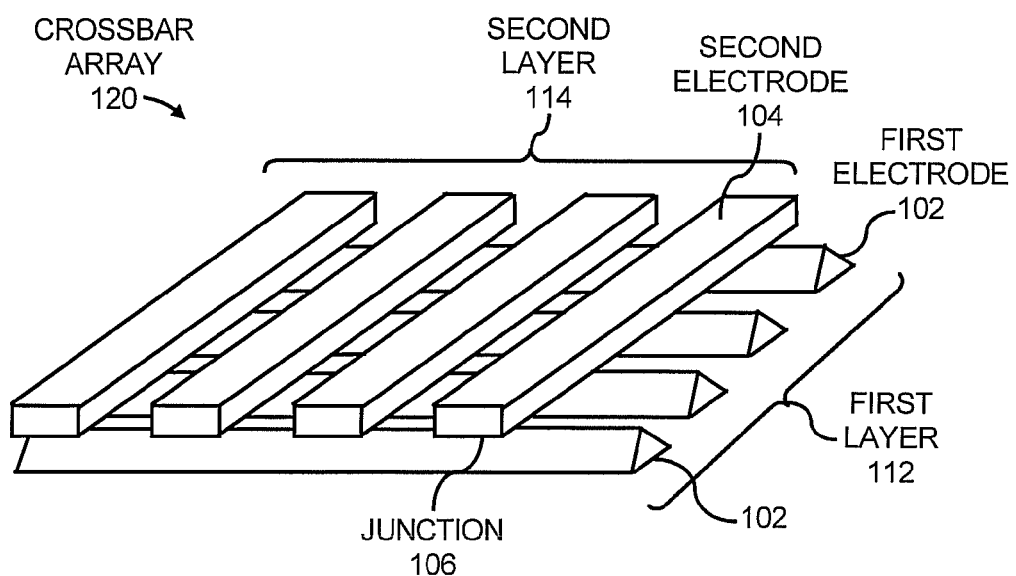
FIG. 1B illustrates a crossbar array employing a plurality of the memristors depicted in FIG. 1A, according to an embodiment of the invention.

With reference now to FIG. 1B, there is shown a crossbar array 120 employing a plurality of the memristors 100 shown in FIG. 1A, according to an embodiment. It should be understood that the crossbar array 120 depicted in FIG. 1B may include additional components and that some of the components described herein may be removed and/or modified without departing from a scope of the crossbar array 120.

As shown in FIG. 1B, a first layer 112 of approximately parallel first electrodes 102 is overlain by a second layer 114 of approximately parallel second electrodes 104. The second layer 114 is roughly perpendicular, in orientation, to the first electrodes 102 of the first layer 112, although the orientation angle between the layers may vary. The two layers 112, 114 form a lattice, or crossbar, with each second electrode 104 of the second layer 114 overlying all of the first electrodes 102 of the first layer 112 and coming into close contact with each first electrode 102 of the first layer 112 at respective junctions 106, which represent the closest contact between two of the first and second electrodes 102 and 104. The crossbar array 120 depicted in FIG. 1B may be fabricated from micron-, submicron or nanoscale-electrodes 102, 104, depending on the application.

Although the second electrodes 104 depicted in FIGS. 1A and 1B are shown with square or rectangular cross-sections, the second electrodes 104 may have circular, elliptical, or more complex cross-sections, such as, triangular cross-sections. The wires may also have many different widths or diameters and aspect ratios or eccentricities. The term "nanowire crossbar" may refer to crossbars having one or more layers of sub-microscale electrodes, microscale electrodes or electrodes with larger dimensions, in addition to nanowires.

Figure 1C:
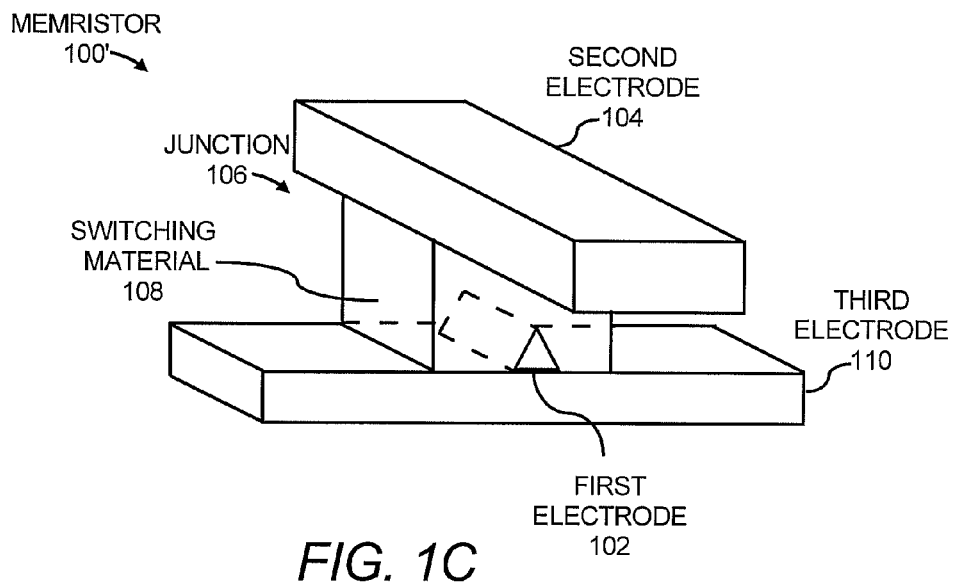
FIG. 1C illustrates a perspective view of a memristor having a first electrode and a second electrode, according to another embodiment of the invention.
Figure 1D:
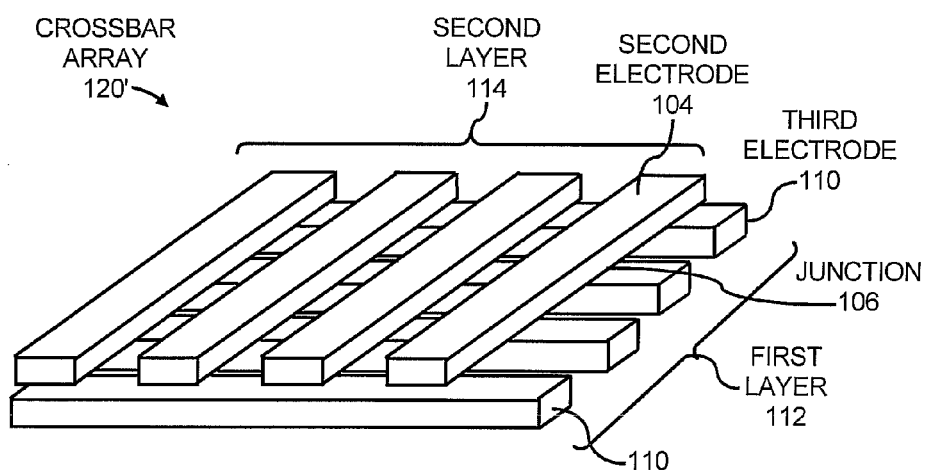
FIG. 1D illustrates a crossbar array employing a plurality of the memristors depicted in FIG. 1C, according to an embodiment of the invention.

An example of an alternate arrangement of the memristor 100' is depicted in FIGS. 1C and 1D. FIG. 1C contains many of the elements as those depicted in FIG. 1A and FIG. 1D contains many of the same elements as those depicted in FIG. 1B. As such, only those features that differ from FIGS. 1A and 1B, respectively, will be discussed with respect to FIGS. 1C and 1D. Similarly to FIGS. 1A and 1B, it should be understood that the memristor 100' depicted in FIGS. 1C and 1D may include additional components and that some of the components described herein may be removed and/or modified without departing from a scope of the memristor 100'. It should also be understood that the components depicted in FIGS. 1C and 1D are not drawn to scale and thus, the components may have different relative sizes with respect to each other than as shown therein.

With reference first to FIG. 1C, there is shown a perspective view of a memristor 100', according to another embodiment. In addition to the elements depicted in the memristor 100 in FIG. 1B, the memristor 100' includes a third electrode 110. More particularly, the first electrode 102 is depicted in FIG. 1C as being positioned on top of the third electrode 110. In addition, the first electrode 102 is depicted as being oriented in the same direction as the second electrode 104. The orientation of the first electrode 102 may, however, be varied without departing from a scope of the memristor 100'.

In the memristor 100' depicted in FIG. 1C, the third electrode 110 may be connected to a voltage source and the first electrode 102 may be electrically connected to the third electrode 110 and may thus receive an electrical charge when the third electrode 110 receives an electrical charge. As such, the first electrode 102 may extend the same or nearly the same distance as the third electrode 110 (for instance, in configurations where the first electrode 102 is co-linear with the third electrode) or the first electrode 102 may extend for relatively short distances with respect to the third electrode 110.

Turning now to FIG. 1D, there is shown a crossbar array 120' employing a plurality of the memristors 100' shown in FIG. 1B, according to an embodiment. In contrast to the crossbar array 120 depicted in FIG. 1B, the first layer 112 of the crossbar array 120' depicted in FIG. 1D is depicted as including a plurality of approximately parallel third electrodes 110. Although not clearly shown, it should be understood that a plurality of the junctions 106 includes at least part of one or more first electrodes 102, as depicted in FIG. 1C.

The memristors 100 and 100' depicted in FIGS. 1B and 1D may be built at the micro- or nano-scale and used as a component in a wide variety of electronic circuits. The memristors 100 and 100' may be used as the basis for memories, switches, and logic circuits and functions. When used as a basis for memories, the memristor 100 and 100' be used to store a bit of information, 1 or 0. When used as a switch, the memristors 100 and 100' may either be a closed or open switch in a cross-point memory. When used as a logic circuit, the memristors 100 and 100' may be employed as bits in a logic circuit that resembles a Field Programmable Gate Array, or as the basis for a wired-logic Programmable Logic Array. The memristors 100 and 100' disclosed herein are also configured to find uses in a wide variety of other applications.

Figure 2A:
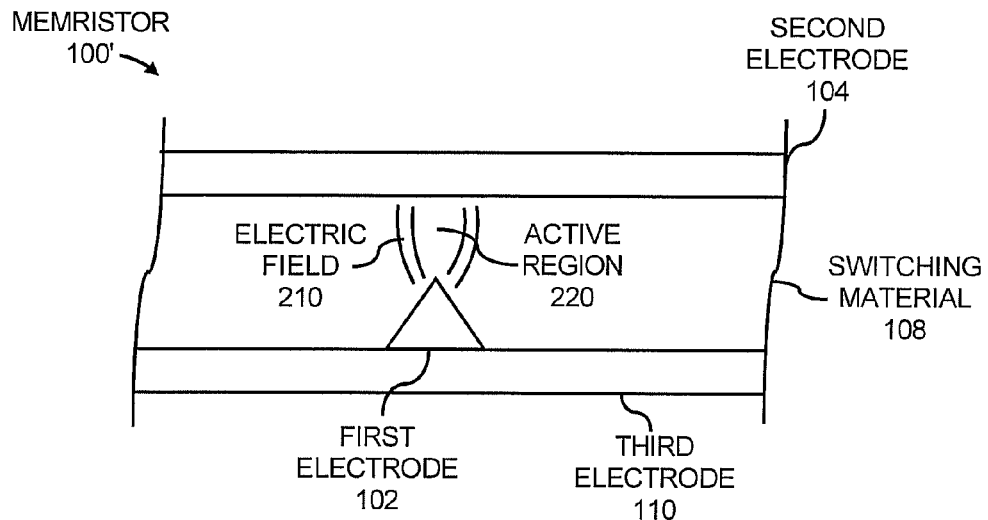
FIG. 2A illustrates an enlarged, cross-sectional front view of the memristor depicted in FIG. 1C, according to an embodiment of the invention.

With reference now to FIG. 2A there is shown an enlarged, cross-sectional front view of the memristor 100' depicted in FIG. 1C, according to an embodiment. Although particular reference is made to the memristor 100', the principles described below with respect to the memristor 100' and the first electrode 102 are equally applicable to the memristor 100 and the first electrode 102 depicted in FIG. 1A. In other words, the principles disclosed herein with respect to FIG. 2A may equally be applied to the memristor depicted in FIGS. 1A and 1B with the third electrode 110 removed.

As shown in FIG. 2A, an electric field 210 is created when a voltage is applied across the first electrode 102 and the second electrode 104. As discussed above with respect to FIG. 1C, the voltage may travel through the first electrode 102 from the third electrode 110. Field lines of the electric field 210 illustrate the intensity of the field between the first electrode 102 and the second electrode 104 when a voltage is applied across the electrodes. Initially the entire switching material 108 is nonconductive. As such, a forming process is required to form a conductive channel in the switching material 108 between the first electrode 102 and the second electrode 104. The forming process includes applying a sufficiently high (threshold) voltage across the first electrode 102 and the second electrode 104 for a sufficient length of time to cause the conductive channel in the switching material 108 to form. The threshold voltage and the length of time required for the forming process may depend upon the type of material used for the switching material 108, the first electrode 102 and the second electrode 104.

The conductive channel formed from the forming process is referred to herein as the active region 220 of the memristor 100'. In addition, the conductivity of the active region 220 may be modulated by applying different biases across the first electrode 102 and the second electrode 104. Thus, the memristor 100' is reconfigurable based upon the bias applied across the first electrode 102 and the second electrode 104. In other instances, the memristor 100' may include a switching material 108 that is singly configurable.

As shown in FIG. 2A, the triangular shape of the first electrode 102 localizes the formation of the conductive channel in the switching material 108 during the forming step. More particularly, the relatively sharper profile of the first electrode 102 as compared with the relatively flat profile of conventional electrodes creates a local field enhancement effect above the first electrode 102. As such, the electric field 210 at the tip of the first electrode 102 is much higher than if the same bias was applied across a flat shaped electrode. In addition to concentrating the electric field 210 during the electroforming step, the triangular shape of the first electrode 102 will also localize the electrochemical reaction that occurs between the first electrode 102 and the switching material 108 and will also localize the mechanical stress during deposition of the switching material 108, all of which may assist in localizing the electroforming of conductive channel in the switching material 108 at the desired location in the memristor 100'.

In a conventional memristor having a relatively flat profile, the conductive channel formed during a forming step may occur at any point along the junction of crossed electrodes. The location of an active region prior to the forming process in a conventional memristor is thus difficult to predict and thus the conventional memristors require that the memristors be spaced with a sufficient margin of error to prevent cross talk between the memristors. In the memristor 100', the conduction channel localization afforded by the triangular shape of the first electrode 102 improves the predictability of the spatial location of the active region 220. The memristors 100' disclosed herein are thus able to be spaced more closely together with reduced risk of cross talk as compared with the conventional memristors.

Figure 2B:
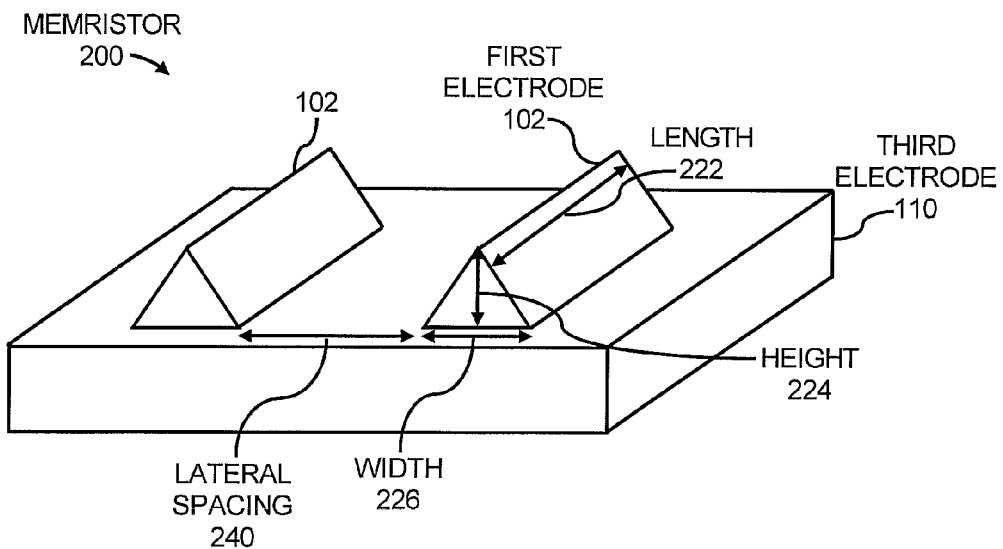
FIG. 2B illustrates a perspective view of a memristor having a plurality of first electrodes, according to an embodiment of the invention.

With reference now to FIG. 2B, there is shown a perspective view of a memristor 200 having a plurality of first electrodes 102, 102', according to an embodiment. It should be understood that the memristor 200 depicted in FIG. 2B may include additional components and that some of the components described herein may be removed and/or modified without departing from a scope of the memristor 200. For instance, the memristor 200 may include any number of first electrodes 102 positioned along the length of the third electrode 110. Alternatively, the third electrode 110 of the memristor 200 may be removed such that the first electrodes 102 form the first layer 112 of the crossbar array 120 depicted in FIG. 1B.

Although not shown in FIG. 2B, it should be noted that a second layer 114 of second electrodes 104 is positioned over the first electrodes 102 such that a different second electrode 104 is positioned over each of the first electrodes 102 and that the second electrodes 104 extend in a similar direction as the first electrodes 102. In the instance that the third electrode 110 is removed, such as in the case of FIGS. 1A and 1B, a second electrode 104 is positioned over both of the first electrodes 102 and extend substantially perpendicularly to the lateral direction of the first electrodes 102.

Generally speaking, the multiple first electrodes 102 have been depicted in FIG. 2B to more particularly denote various other aspects of the first electrodes 102. For instance, FIG. 2B shows that each of the first electrodes 102 has a length 222, a height 224, and a width 226. According to an embodiment, the heights 224 and the widths 226 of the first electrodes 102 is of the order of nanometers. In addition, the length 222 of the first electrode 102 is of the order of hundreds of nanometers to microns. According to an example, the first electrodes 102 are sized to have dimensions that are significantly larger than surface deformations on the second electrode 104 and the third electrode 110. In addition, a minimum lateral spacing 240 between the first electrodes 102 may be determined to be a minimum distance that substantially prevents crosstalk between the laterally spaced first electrodes 102. The minimum lateral spacing 240 may be substantially smaller, for instance, on the order of tens of nanometers to microns, than that allowed in memristors with conventional electrodes because of the greater predictability of formation of the active region 204.

Figure 3A:
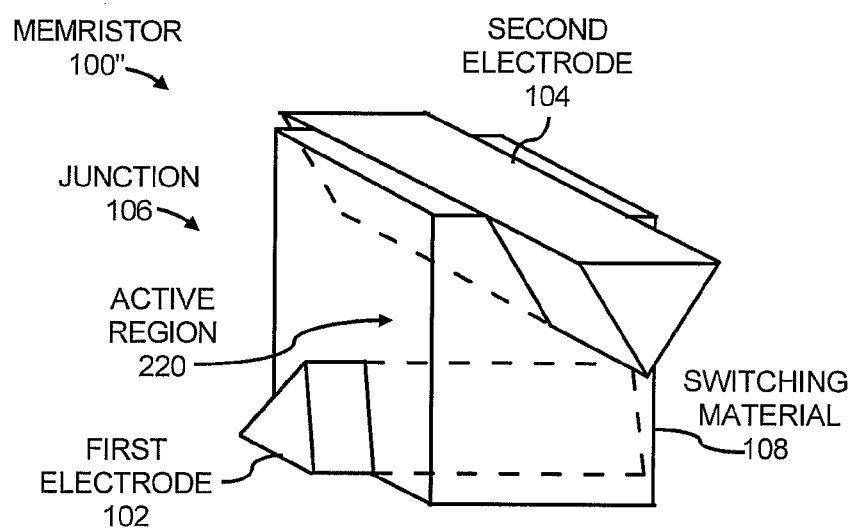
FIG. 3A illustrates a perspective view of a memristor, in which both the first electrode and the second electrode have triangular cross sections, according to an embodiment of the invention.

With reference now to FIG. 3A, there is shown a perspective view of a memristor 100'', in which both the first electrode 102 and the second electrode 104 have triangular cross-sections, according to an embodiment. The memristor 100'' includes all of the same elements as the memristor 100 depicted in FIG. 1A, with the only difference being the shape of the second electrode 104. In addition, as shown therein, the base of the second electrode 104 faces away from the first electrode 102 and the relatively sharp tip of the second electrode 104 faces toward the first electrode 102. In one regard, the electric field 210 forming the active region 220 between the first electrode 102 and the second electrode 104 may be further enhanced as compared with conventional memristor structures through the local field enhancement effect above the first electrode 102 and bellow the second electrode 104. In addition, the second electrode 104 having the triangular cross section has all of the same properties as those discussed above with respect to the first electrode 102.

Figure 3B:
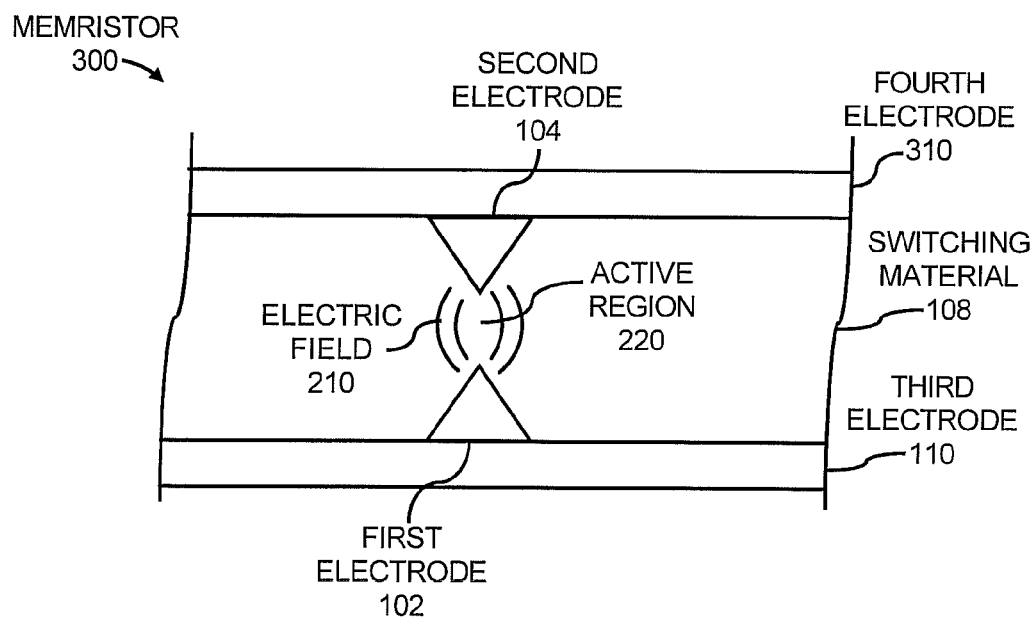
FIG. 3B illustrates a memristor in which the second electrode also includes a triangular cross section and is positioned in a substantially aligned arrangement with the first electrode, according to an embodiment of the invention.

Turning now to FIG. 3B, there is shown a memristor 300 in which the second electrode 104 also includes a triangular cross section and is positioned in a substantially aligned arrangement with the first electrode 102, according to an embodiment. It should be understood that the memristor 300 depicted in FIG. 3A may include additional components and that some of the components described herein may be removed and/or modified without departing from a scope of the memristor 300.

As shown in FIG. 3B, the second electrode 104 also has a triangular cross-sectional shape with the base of the second electrode 104 positioned on a fourth electrode 310 and the tip of the second electrode 104 facing the tip of the first electrode 102. In addition, the second electrode 104 extends in approximately the same direction as the first electrode 102. As such, one of the first electrode 102 and the second electrode 104 extends in the same direction as one of the third electrode 110 and the fourth electrode 310 and the other of the first electrode 102 and the second electrode 104 extends perpendicularly to one of the third electrode 110 and the fourth electrode 310.

As an alternative to the configuration depicted in FIG. 3B, one of the third electrode 110 and the fourth electrode 310 and may be removed. In this configuration, the first electrode 102 or the second electrode 104 is configured to have voltage supplied directly therethrough.

Figure 3C:
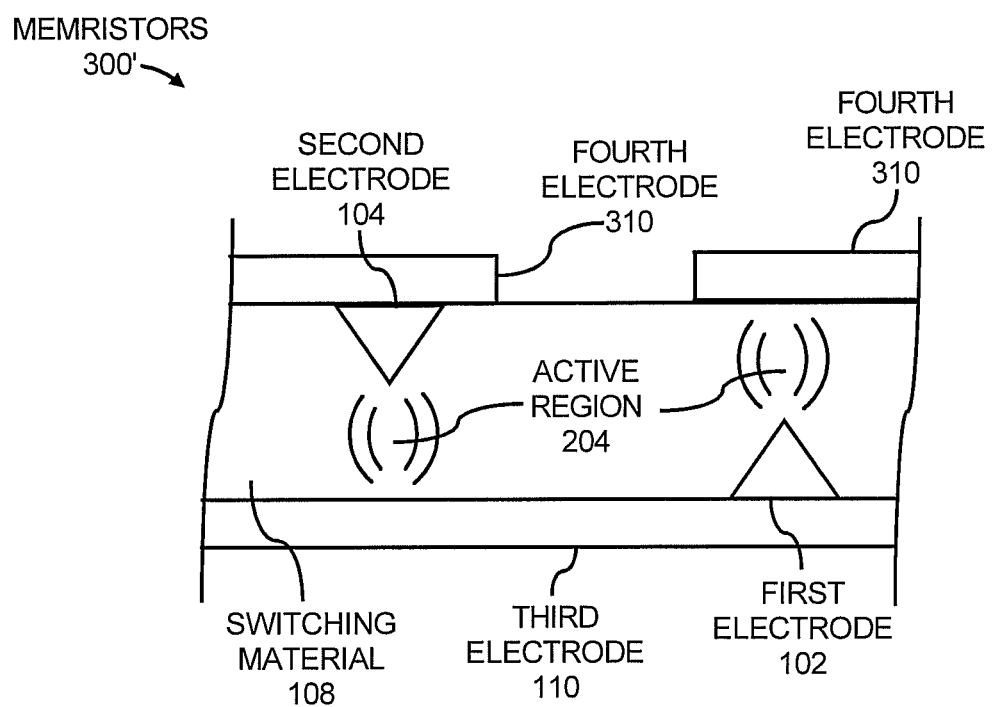
FIG. 3C illustrates a cross-sectional side view of a plurality of memristors, according to another embodiment.

FIG. 3C illustrates a cross-sectional side view of a plurality of memristors 300', according to a further embodiment. It should be understood that the memristors 300' depicted in FIG. 3C may include additional components and that some of the components described herein may be removed and/or modified without departing from a scope of the memristors 300'.

As shown therein, the memristors 300' are formed at junctions 106 between a first electrode 102 and a pair of fourth electrodes 310. As such, the view depicted in FIG. 3C is similar to a cross-sectional side view taken along multiple electrodes and junctions 106 in FIG. 1D, in which the fourth electrodes 310 form the second electrodes 104 depicted in FIG. 1D. In this regard, the second electrodes 104 may be positioned on alternating fourth electrodes 310 and the first electrode 102 may be positioned along the third electrode 110 to substantially be aligned with other alternating fourth electrodes 310.

It should be understood that the memristors depicted in the figures discussed above may be modified in various respects without departing from a scope of those disclosed memristors. By way of example, the switching material 108 may be composed of a dual layer structure as described in greater detail in the 20080090337 U.S. Patent Application Publication. As disclosed therein, the dual layer structure of the switching material enhances the switching properties and operation of devices using electrically actuated switches constructed therewith. That application for patent also describes a wide combination of materials than can be used to facilitate the switching process using the dual layer structure.

In one embodiment disclosed in that application for patent, the switching material comprises a thin titanium layer formed over a molecule having a switchable segment or moiety that is relatively energetically stable in two different states. The switchable molecule and the thin titanium layer form the switch junction connecting the electrodes.

The memristors disclosed herein may be fabricated by modification of processes described in greater detail in that application for patent. For instance, the memristors may be manufactured through use of a wide range of material deposition and processing techniques. By way of particular example, the first electrode 102, and in certain instances, such as the configurations depicted in FIGS. 3A-3C, the second electrode 104, may be fabricated through use of fixed angle deposition of platinum or shadow mask evaporation. In addition, the third electrode 110 and the fourth electrode 310 may be fabricated using conventional techniques such as photolithography or electron beam lithography, or by more advanced techniques, such as imprint lithography.

Although a particular process for fabricating the memristors disclosed herein have been provided, it should be understood that other fabrication methods may also be used to fabricate the memristors.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A memristor comprising:
    a first electrode having a triangular cross section, said first electrode having a tip and a base, and wherein the first electrode is elongated along at least one dimension;
    a switching material positioned upon said first electrode; and
    a second electrode positioned upon said switching material, wherein the tip of the first electrode faces the second electrode, and wherein an active region in the switching material is formed adjacent to the tip of the first electrode.

2. The memristor of claim 1, further comprising:
    a third electrode, wherein the base of the first electrode is in electrical contact with the third electrode.

3. The memristor of claim 1, wherein the second electrode comprises a triangular cross section having a tip and a base, and wherein the tip of the second electrode faces the tip of the first electrode.

4. The memristor of claim 1, wherein the second electrode comprises a triangular cross section having a tip and a base, said memristor further comprising:
    a fourth electrode, wherein the base of the second electrode is in electrical contact with the fourth electrode.

5. The memristor of claim 4, wherein the second electrode is spaced from the first electrode such that switching material located adjacent to the tip of the second electrode forms a separate active region from the active region formed adjacent to the tip of the first electrode.

6. A memristor comprising:
    a first electrode having a triangular cross section, said first electrode having a tip and a base;
    a switching material positioned upon said first electrode; and
    a second electrode positioned upon said switching material, wherein the tip of the first electrode faces the second electrode, and wherein an active region in the switching material is formed adjacent to the tip of the first electrode, wherein the first electrode comprises platinum and wherein the switching material comprises a metal oxide.

7. A memristor comprising:
    a first electrode having a triangular cross section, said first electrode having a tip and a base, wherein the first electrode has a height, a width and a length, and wherein the height and the width are of the order of nanometers and wherein the length is of the order of hundreds of nanometers to microns;

a switching material positioned upon said first electrode; and a second electrode positioned upon said switching material, wherein the tip of the first electrode faces the second electrode, and wherein an active region in the switching material is formed adjacent to the tip of the first electrode.

8. A crossbar array composed of a plurality of memristors of claim 1, said crossbar array comprising:

a plurality of the first electrodes positioned approximately parallel with respect to each other, each of said plurality of first electrodes having the triangular cross section, with a tip and a base; and a plurality of the second electrodes positioned approximately parallel with respect to each other and approximately perpendicularly with the plurality of first electrodes, wherein the tips of the plurality of first electrodes face respective ones of the plurality of second electrodes, wherein the switching material is positioned upon the plurality of first electrodes, and wherein active regions in the switching material are formed adjacent to the tips of the plurality of first electrodes.

9. The crossbar array of claim 8, further comprising:

a plurality of third electrodes, wherein the bases of the plurality of first electrodes are in electrical contact with respective ones of the plurality of third electrodes.

10. The crossbar array of claim 8, wherein the plurality of second electrodes comprise triangular cross sections, with respective tips and bases.

11. The crossbar array of claim 10, said crossbar array further comprising:

a plurality of fourth electrodes, wherein the bases of the plurality of second electrodes are in electrical contact with respective ones of the plurality of fourth electrodes.

12. The crossbar array of claim 11, wherein each of the plurality of second electrodes is spaced from a plurality of first electrodes such that switching material located adjacent to the tips of the plurality of second electrodes forms separate active regions from the active regions formed adjacent to the tips of the plurality of first electrodes.

13. The crossbar array of claim 8, wherein each of the plurality of first electrodes has a height, a width and a length, and wherein the height and the width are of the order of nanometers and wherein the length is of the order of hundreds of nanometers to microns.

14. A method for performing a forming process in order to initiate switching behavior in the memristor of claim 1, said method comprising:

impressing a threshold voltage through the tip of the first electrode, the switching material adjacent to the tip of the first electrode, and through the second electrode for a sufficient length of time to cause a predictable and discrete active region of high conductivity to form within the switching material adjacent to the tip of the first electrode.

* * * * *

UNITED STATES PATENT AND TRADEMARK OFFICE
CERTIFICATE OF CORRECTION

| | |
|---|---|
| PATENT NO. | : 8,431,921 B2 |
| APPLICATION NO. | : 13/130827 |
| DATED | : April 30, 2013 |
| INVENTOR(S) | : Matthew D. Pickett et al. |

It is certified that error appears in the above-identified patent and that said Letters Patent is hereby corrected as shown below:

In the Claims:

In column 9, line 3, in Claim 7, delete "microns; 7" and insert -- microns; --, therefor.

Signed and Sealed this
First Day of October, 2013

Teresa Stanek Rea
*Deputy Director of the United States Patent and Trademark Office*